United States Patent
Guermandi et al.

(10) Patent No.: US 9,461,679 B2
(45) Date of Patent: Oct. 4, 2016

(54) SYSTEM, METHOD, AND APPARATUS FOR ANALOG SIGNAL CONDITIONING OF HIGH-SPEED DATA STREAMS

(71) Applicant: BROADCOM CORPORATION, Irvine, CA (US)

(72) Inventors: Davide Guermandi, Utrecht (NL); Silvian Spiridon, Utrecht (NL); Dongsoo Daniel Koh, Irvine, CA (US); Stefano Bozzola, Utrecht (NL); Han Yan, Rotterdam (NL); Mattia Introini, Utrecht (NL); Tao Wu, Beijing (CN)

(73) Assignee: BROADCOM CORPORATION, Irvine, CA (US)

( * ) Notice: Subject to any disclaimer, the term of this patent is extended or adjusted under 35 U.S.C. 154(b) by 0 days.

(21) Appl. No.: 14/689,036

(22) Filed: Apr. 16, 2015

(65) Prior Publication Data

US 2015/0303954 A1  Oct. 22, 2015

Related U.S. Application Data

(60) Provisional application No. 61/980,499, filed on Apr. 16, 2014.

(51) Int. Cl.
| | |
|---|---|
| *H04B 1/10* | (2006.01) |
| *H04B 1/00* | (2006.01) |
| *H03F 1/32* | (2006.01) |
| *H03F 3/45* | (2006.01) |

(52) U.S. Cl.
CPC *H04B 1/10* (2013.01); *H03F 1/32* (2013.01); *H03F 3/45475* (2013.01); *H04B 1/0017* (2013.01); *H03F 2200/336* (2013.01); *H03F 2200/411* (2013.01); *H03F 2203/45212* (2013.01); *H03F 2203/45528* (2013.01); *H03F 2203/45591* (2013.01); *H03F 2203/45594* (2013.01); *H03F 2203/45616* (2013.01)

(58) Field of Classification Search
CPC .............................. H04B 1/1027; H04B 1/10
USPC .......................................................... 455/296
See application file for complete search history.

(56) References Cited

U.S. PATENT DOCUMENTS

| | | | | |
|---|---|---|---|---|
| 5,603,114 | A * | 2/1997 | Tomita | H03G 3/3052 455/249.1 |
| 7,130,604 | B1 * | 10/2006 | Wong | H03D 7/12 455/302 |
| 2005/0239430 | A1 * | 10/2005 | Shah | H03D 7/14 455/326 |
| 2007/0105517 | A1 * | 5/2007 | Chang | H03G 1/0088 455/249.1 |
| 2010/0189197 | A1 * | 7/2010 | Nakatani | H04B 1/28 375/340 |

* cited by examiner

*Primary Examiner* — Sanh Phu
(74) *Attorney, Agent, or Firm* — Oblon, McClelland, Maier & Neustadt, L.L.P.

(57) ABSTRACT

A device includes circuitry configured to receive a signal burst, apply one or more filters to the signal burst based to achieve a predetermined image rejection rate, apply at least one harmonic rejection mode to the signal burst, and amplify the signal burst based on a gain partitioning determination.

20 Claims, 10 Drawing Sheets

SYSTEM, METHOD, AND APPARATUS FOR ANALOG SIGNAL CONDITIONING OF HIGH-SPEED DATA STREAMS

BACKGROUND

The "background" description provided herein is for the purpose of generally presenting the context of the disclosure. Work of the presently named inventors, to the extent it is described in this background section, as well as aspects of the description which may not otherwise qualify as prior art at the time of filing, are neither expressly or impliedly admitted as prior art against the present invention.

The increasing demand for reliable high definition video and data streaming on cable has led to the extension of cable bandwidth usage. On top of cable television (CATV), today's coax cable house networks are shared by satellite, LAN, and also Ultra-HDTV data streams. Harmonic Rejection (HR) Software Defined Receivers (SDRXs) enable Ultra HDTV streaming over cable as well as other emerging multimedia over coax (MoCA) technologies.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
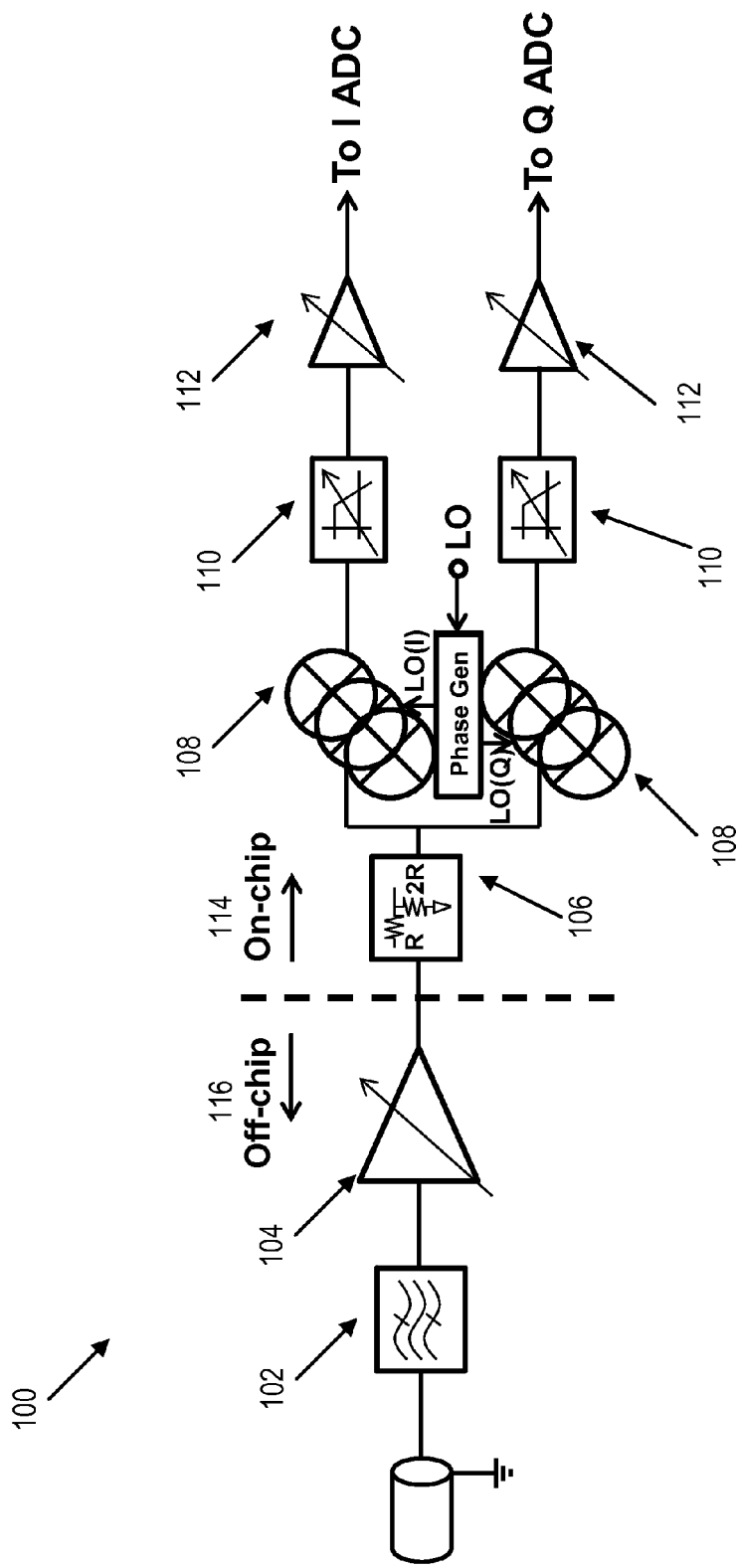
FIG. 1 is an exemplary block diagram of a Software Defined Receiver (SDRX), according to certain embodiments.

In the drawings, like reference numerals designate identical or corresponding parts throughout the several views. Further, as used herein, the words "a," "an" and the like generally carry a meaning of "one or more," unless stated otherwise. The drawings are generally drawn to scale unless specified otherwise or illustrating schematic structures or flowcharts.

Furthermore, the terms "approximately," "approximate," "about," and similar terms generally refer to ranges that include the identified value within a margin of 20%, 10%, or preferably 5%, and any values therebetween.

In an exemplary embodiment, a device includes circuitry configured to receive a signal burst, apply one or more filters to the signal burst based to achieve a predetermined image rejection rate, apply at least one harmonic rejection mode to the signal burst, and amplify the signal burst based on a gain partitioning determination.

Aspects of the disclosure are directed to a front end of a Software Defined Receiver (SDRX). FIG. 1 is an exemplary block diagram of a Software Defined Receiver (SDRX) 100, according to certain embodiments. Throughout the disclosure the SDRX 100 can interchangeably be referred to as the RX. Exemplary specifications of the SDRX 100 are illustrated in Table I. The specifications described by Table 1 are merely exemplary and are not meant to limit the possible specifications of the SDRX 100. The SDRX 100 implements a harmonic rejection quadrature topology described by, F. Gatta et al., "An embedded 65 nm CMOS low-IF 48 MHz-to-1 GHz dual tuner for DOCSIS 3.0," *IEEE Journal of Solid-State Circuits*, Vol. 44, No. 12, pp. 3511-3525, December 2009.

TABLE I

TYPICAL REQUIREMENTS FOR THE RECEIVER

| Parameter | Value |
| --- | --- |
| Frequency Bands | Up to 1800 MHz |
| RF Signal Bandwidth | From 50 to 225 MHz |
| ACI/out-of-band blockers | +8 dBc/up to −2 dBm |
| Signal | Multiple carriers on OFDM support (Peak-to-Average Ratio = 15 dB) |
| SNDR @ RX front-end output | >33 dB |

The SDRX 100 includes an on-chip front end 114, which can include a 28 nanometer (nm) CMOS software-reconfigurable harmonic rejection quadrature homodyne receiver driven by an external bipolar SiGe Low Noise Amplifier (LNA) 104. In some implementations, the LNA 104 is included in an off-chip back end 116 of the SDRX 100. The off-chip back end can also include a bandpass filter circuit 102, such as a MoCA triplex filter. The bandpass filter circuit 102 can provide up to 40 dB of attenuation for out-of-band blockers without affecting adjacent channel interference (ACI). A controller (not shown) with processing circuitry can also be included that can control the operation of the on-chip 114 components, as will be discussed further herein.

The on-chip front end 114 can include an internal passive attenuator (RFPGA) 106, at least one harmonic rejection down-conversion mixer (HRMIX) 108 for I/Q channels, at least one low pass filter 110 for I/Q channels, and at least one baseband programmable gain amplifier (IFPGA) 112 for I/Q channels. The values LPF 110 resistors and capacitors can be selected so that an image rejection (IR) rate of greater than 40 dB can be achieved. In addition, the gain bandwidth product of the LPF 110 bi-quad operational amplifiers (opamps) can be designed to be high enough to avoid the I and Q opamps mismatch influence on the IR at the intermediate frequency (IF) band edge. The LPF is placed after the HRMIX 108 to provide additional selectivity and reduce occurrences of signal aliasing by an analog-to-digital converter.

The output of the SDRX 100 is sent to I and Q analog-to-digital converters (ADCs). From the system-level point of view, a Full Band Capture with digitization and channel selection in the digital domain by means of a wideband ADC can be implemented. In some implementations, an ADC exhibiting 10-bit ENOB (effective number of bits) at 1.8 GHz is can be used. In spite of an aggressive trend in ADC power consumption decrease described in B. Murmann. (2013, Apr. 12th), "ADC Performance Survey 1997-2013,"

[Online]. Available at: http://www.stanford.edu/~murmann/adcsurvey.html., the SDRX 100 may still more power-efficient.

Figure 2:
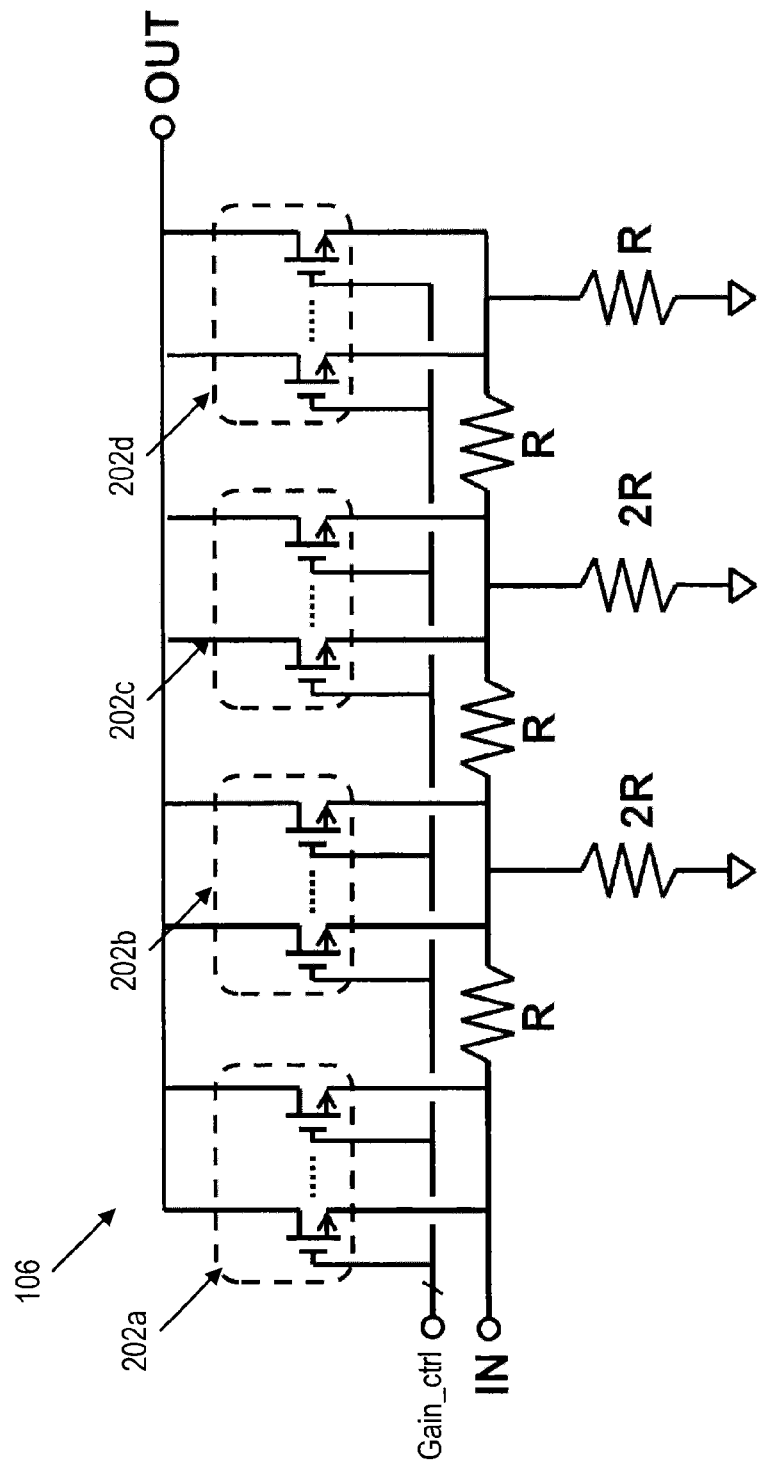
FIG. 2 is an exemplary block diagram of an internal passive attenuator, according to certain embodiments.

FIG. 2 is an exemplary block diagram of a RFPGA 106, according to certain embodiments. For some cable implementations, sudden variations in the signal dynamic may not be expected during the receive burst. Thus, when SDRX loading has a stability level that is greater than a predetermined threshold, a low-gain step such as a 0.5 dB fine-gain step can be used in the RFPGA 106 to enable the SDRX signal-to-noise ratio (SNR) to be enhanced by optimizing loading for the mixer.

The low-gain step can be accomplished via the R-2R resistive ladder shown in the RFPGA 106 in FIG. 2. For example, the structure of the RFPGA 106 can provide a 6 dB coarse attenuation step by toggling one of the four groups of switches (202a, 202b, 202c, and 202d). In some implementations, each group of switches 202a, 202b, 202c, and 202d can include twelve switches. The controller issues control signals to modify which switches turn on and off via the gain control (Gain_ctrl) signal line. A gain step of 0.5 dB can be achieved by interpolating between adjacent sets of switches. For example, if n switches in one set are on, 12-n switches are on in the adjacent set of switches. By implementing the interpolation between adjacent sets of switches, the R-2R network complexity for the 0.5 dB gain step can be reduced, which can reduce and/or minimize high-frequency roll-off.

Figure 3:
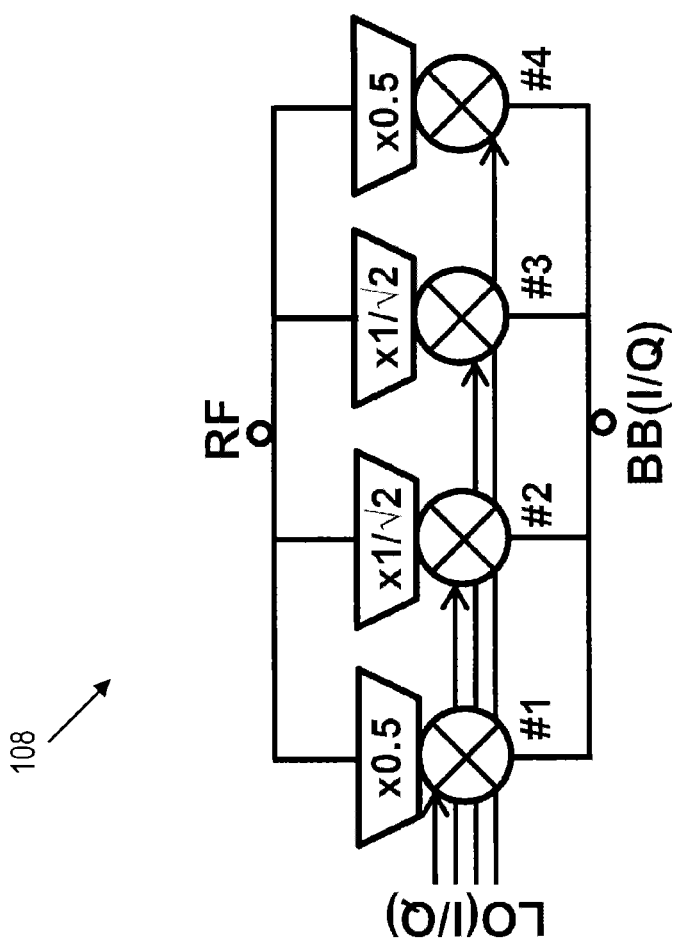
FIG. 3A is an exemplary block diagram of a harmonic rejection down-converter, according to certain embodiments.
FIG. 3B is an exemplary illustration of local oscillator modes, according to certain embodiments.

FIG. 3A is an exemplary block diagram of a HRMIX 108, according to certain embodiments. To reduce the desired signal's corruption due to the down-conversion of unwanted signals present on the cable at higher local oscillator (LO) harmonics frequencies, the RX implements the HR architecture for the down-conversion mixer according to J. A. Weldon et al., "A 1.75 GHz highly-integrated narrow-band CMOS transmitter with harmonic-rejection mixers," 2001 ISSCC Dig. Tech. Papers, pp. 160-161, February 2001, which can reduce the complexity and cost of the external bandpass filter circuit 102. In cable spectrum implementations, the first relevant band may start above 400 MHz, and the information on the cable can extend to 2.15 GHz (i.e., in case of cohabitation with Satellite ODU applications), which means that only up to the 5th LO harmonic may need to be rejected.

Harmonic rejection (HR) can be achieved in the HRMIX 108 by driving four weighted mixer cores (#1, #2, #3, and #4) with phased out LO signals, according to one implementation. The mixer cores include a degenerated pseudo-differential pair driving a pair of switches for each LO. To obtain the different LO phases over a predetermined frequency range according to FIG. 3B, a programmable Johnson counter can be used. Switching between HR modes can be achieved via the LO signal by issuing control signals to reconfigure the HRMIX 108.

FIG. 3B is an exemplary illustration of LO modes for the HRMIX 108 for the I phase, according to certain embodiments. The HRMIX 108 is a double-balanced mixer and can have three operation modes. In a first mode, the HRMIX rejects the 3rd and 5th LO harmonic (HR35). In a second mode, the 3rd LO harmonic (HR3) is rejected, and in a third mode no harmonic rejection is performed (no HR). FIG. 3B also shows how each of the three HR modes is implemented with respect to LO #1, #2, #3, and #4. The processing circuitry of the controller determines the mode of HR and issues control signals to reconfigure the LO signals. The Q phase also has corresponding LO modes for the HRMIX 108.

Figure 4:
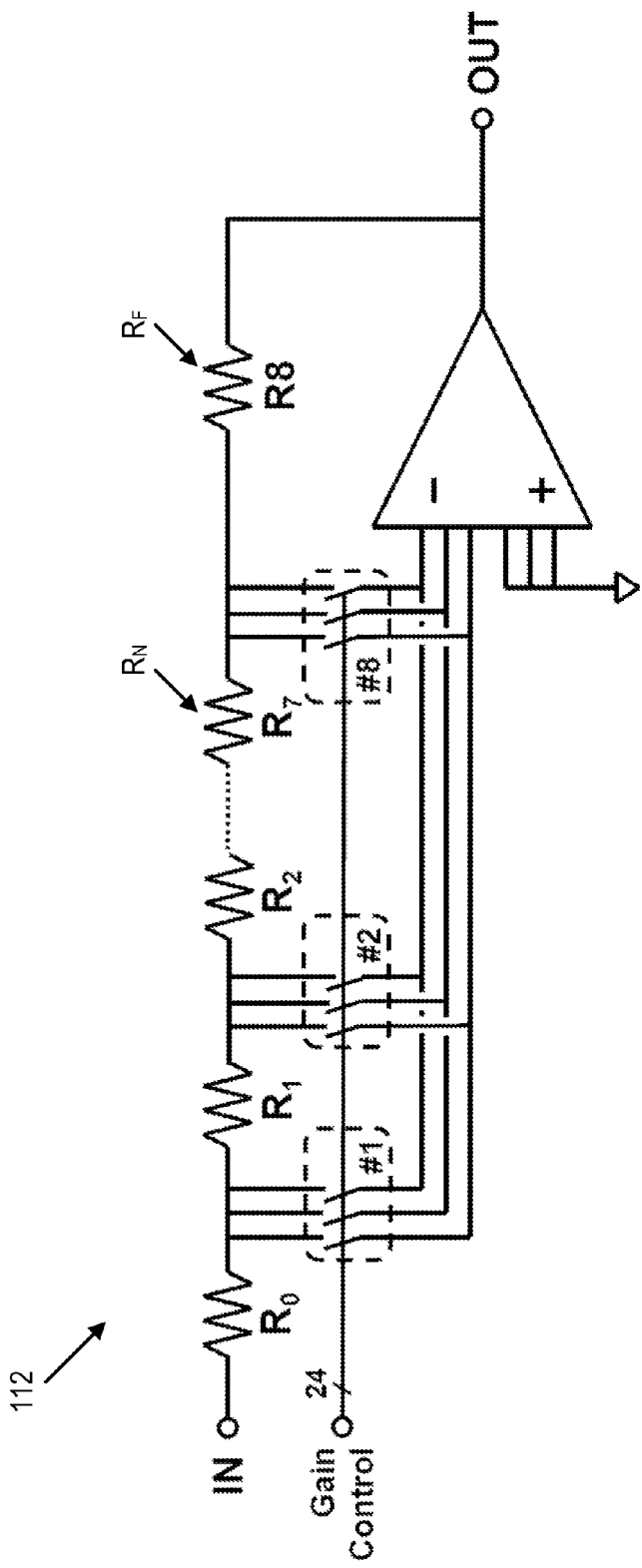
FIG. 4 is an exemplary block diagram of a baseband programmable gain amplifier, according to certain embodiments.

FIG. 4 is an exemplary block diagram of an IFPGA 112, according to certain embodiments. The IFPGA 112 can be a resistive feedback amplifier with programmable gain range between 0 . . . 21 dB with a gain step of 0.5 dB. In some implementations, the IFPGA 112 can be used to ensure that the ADC is optimally loaded. The IFPGA 112 also has embedded DC offset compensation circuitry. The IFPGA 112 opamp input can be split into n differential pairs to reduce the complexity of the feedback to achieve a k-dB gain step resolution. Also, the programmable gain amplifier (PGA) linearity can be enhanced by putting gain control switches in series with other high impedance opamp inputs and not on the signal control path. Course gain control can be achieved by selecting values for resistors $R_1$ to $R_N$ to achieve a gain step of n×k when toggling one of the N groups of switches. The controller issues control signals to modify which switches turn on and off via the gain control (Gain_ctrl) signal line.

In the example shown by FIG. 4, N is equal to 7, and n is equal to 3. By splitting the feedback amplifier differential pairs into three, a fine 1 dB gain control is achieved by the IFPGA 112 by interpolating the three negative op amp inputs between any adjacent $R_i$ and $R_{i+1}$ resistors with i=1 . . . 7. Thus, the IFPGA gain is increased by 1, 2, or 3 dB. The course-gain control is realized by selecting values for resistors $R_1$ to $R_7$ resistors accordingly to achieve a gain step of 3 dB when toggling one of the eight groups of switches.

In one implementation, the gain is calculated for an IFPGA 112 n=2 opamp inputs and N=2 according to the equation, $$\left|\frac{OUT}{IN}\right| \cong \frac{2}{\beta_1+\beta_2} = \frac{2}{\left(\frac{R_F+k_{i1}R_2}{R_1+(1-k_{i1})R_2}\right)^{-1}+\left(\frac{R_F+k_{i2}R_2}{R_1+(1-k_{i2})R_2}\right)^{-1}},$$

where $k_{i1}$ is a switch interpolation coefficient for a first opamp input, and $k_{i2}$ is a switch interpolation coefficient for a second opamp input. By making $k_{i1}$ close to $k_{i2}$, a lower gain resolution can be achieved.

The IFPGA 112 reduces the complexity of the feedback network required for the 1 dB gain step, while also enhancing PGA, because the switches are not placed on the signal path. Accounting for the 20 dB HRMIX 108 gain, the total SRDX 100 dynamic range adds up to 61 dB according to some implementations.

Figure 5:
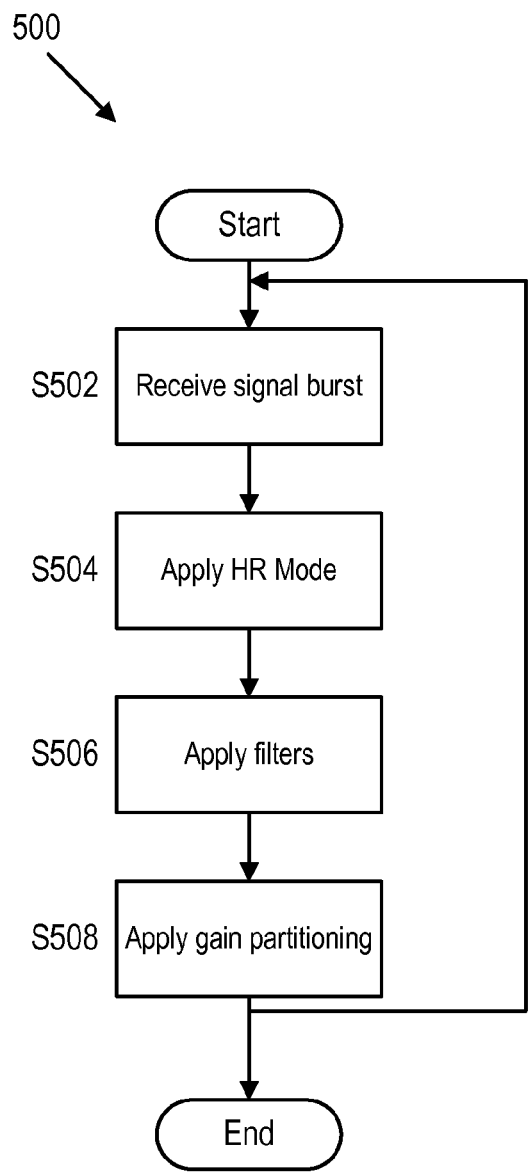
FIG. 5 is an exemplary flowchart of a SDRX process, according to certain embodiments.

FIG. 5 is an exemplary flowchart of a SDRX process 500, according to certain embodiments. Like any software-defined receiver, the implemented SDRX 100 can modify the linearity and noise performance based on the received burst characteristics by changing gain settings via an Automated Gain Control (AGC) loop. The AGC loop partitions the receiver gain between the gain blocks, before each communication burst. By measuring the Receiver Signal Strength Indicator (RSSI) at the receiver ADC output, the AGC loop estimates the input signal power and sets the receiver RF and baseband gain such that the SNR at the SDRX output is above a predetermined target, such as 33 dB.

At step S502, the SDRX 100 receives a signal burst. The signal burst can include CATV, LAN, Ultra-HDTV, Satellite, and/or another type of data stream from a coax. At step S504, the HR mode for the HRMIX 108 is implemented. HR can be achieved in the HRMIX 108 by driving four weighted mixer cores (#1, #2, #3, and #4) with phased out LO signals, according to one implementation. The mixer cores include a degenerated pseudo-differential pair driving a pair of switches for each LO. To obtain the different LO phases over a predetermined frequency range according to FIG. 3B, a programmable Johnson counter can be used. Switching between HR modes can be achieved via the LO signal by issuing control signals to reconfigure the HRMIX 108.

At step S506, the received signal is filtered. Filtering occurs at both the off-chip backend 116 and the on-chip front end 114 of the SDRX 100. The off-chip back end can include a bandpass filter circuit 102, such as a MoCA triplex filter. The bandpass filter circuit 102 can provide up to 40 dB of attenuation for out-of-band blockers without affecting adjacent channel interference (ACI). In addition, the LPF 110 in the front end 114 of the SDRX 100 includes resistors and capacitors that can be selected so that an image rejection (IR) of greater than 40 dB can be achieved. In addition, the gain bandwidth product of the LPF 110 bi-quad operational amplifiers (opamps) can be designed to be high enough to avoid the I and Q opamps mismatch influence on the IR at the intermediate frequency (IF) band edge.

At step S508, gain partitioning is applied to the signal to achieve predetermined SDRX performance criteria. For example, when the received signal power is small relative to an average signal power, the RF front-end gain can be maximized to ensure a minimal RX Noise Figure (NF). For example, the external LNA 104 can be set to a gain of 20 dB, while the RFPGA 106 can be set at 0 dB. On the other hand, when the received signal power is large compared to an average signal power, to enable a highly linear RX response, the external LNA 104 can function as a follower, while the internal RFPGA 106 can be set to attenuate −18 dB.

In addition, to ensure that the ADC is optimally loaded, the SDRX 100 employs the IFPGA 112 as discussed previously herein. The IFPGA 112 opamp input can be split into n differential pairs to reduce the complexity of the feedback to achieve a k-dB gain step resolution. Also, the programmable gain amplifier (PGA) linearity can be enhanced by putting gain control switches in series with other high impedance opamp inputs and not on the signal control path. Course gain control can be achieved by selecting values for resistors $R_1$ to $R_N$ to achieve a gain step of n×k when toggling one of the N groups of switches. The controller issues control signals to modify which switches turn on and off via the gain control (Gain_ctrl) signal line.

Figure 6:
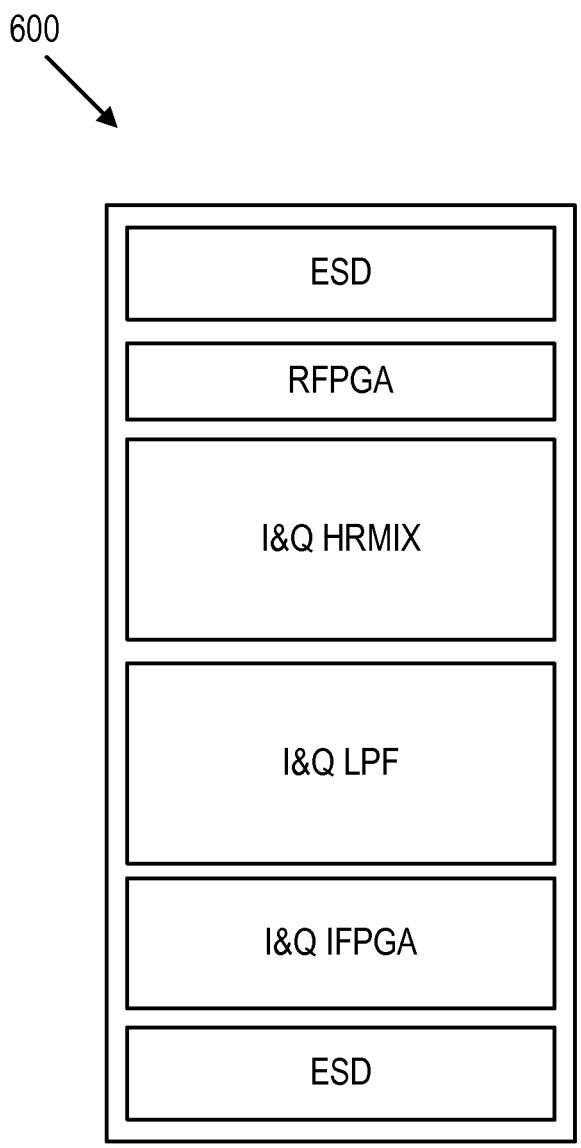
FIG. 6 is an exemplary illustration of a die photo, according to certain embodiments.

FIG. 6 is an exemplary illustration of a die photo 600, according to certain embodiments. The die photo includes electrostatic discharge surface (ESD) structures, RFPGA, I&Q HRMIX, I&Z LPF, and I&Q IFPGA.

Figure 7A:
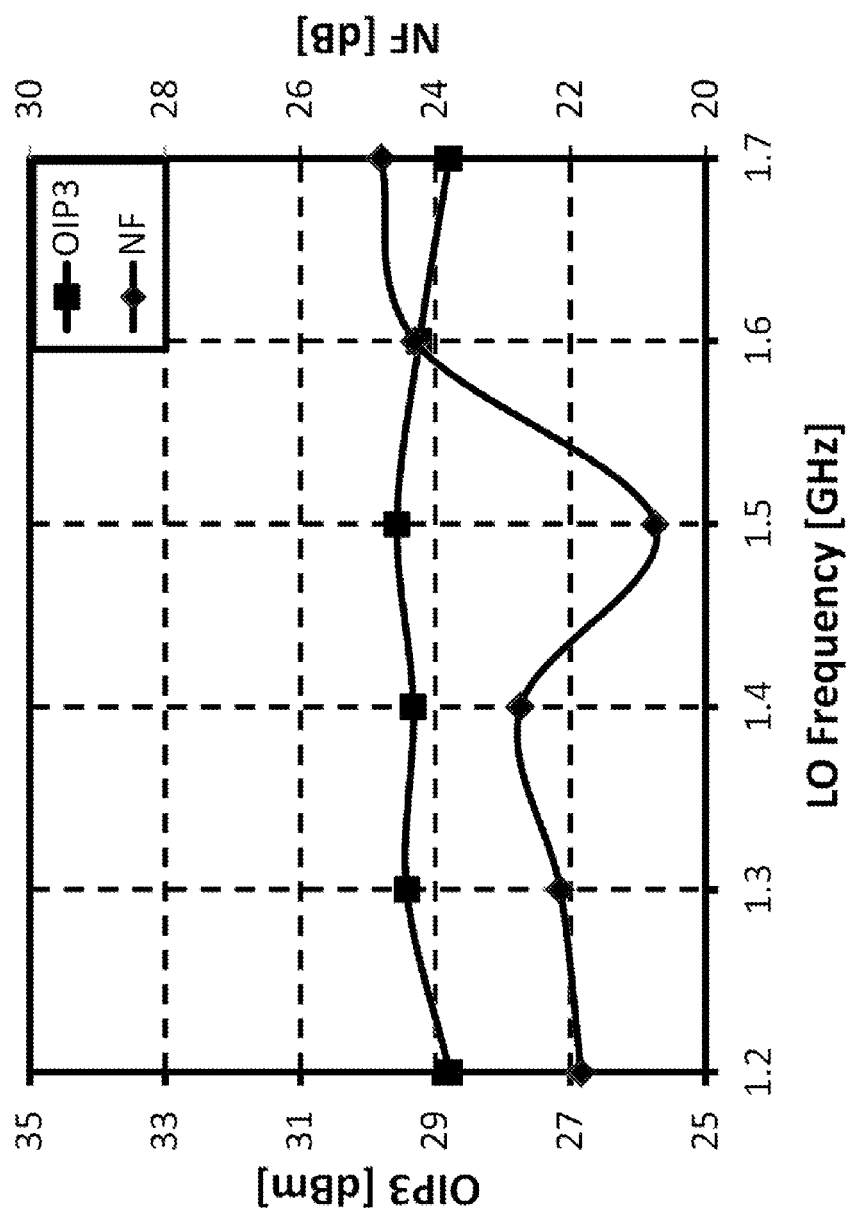
FIGS. 7A-7C are exemplary graphs of measurement results, according to certain embodiments.
Figure 7B:
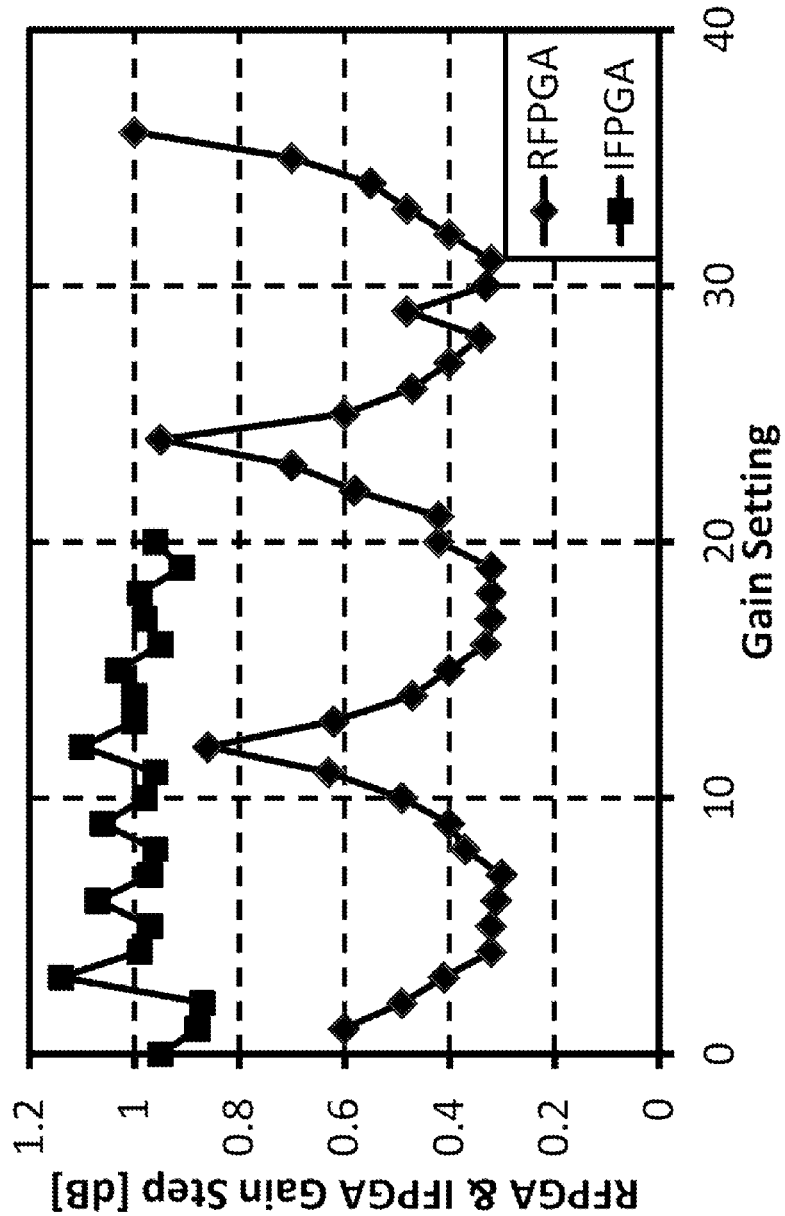
Figure 7C:
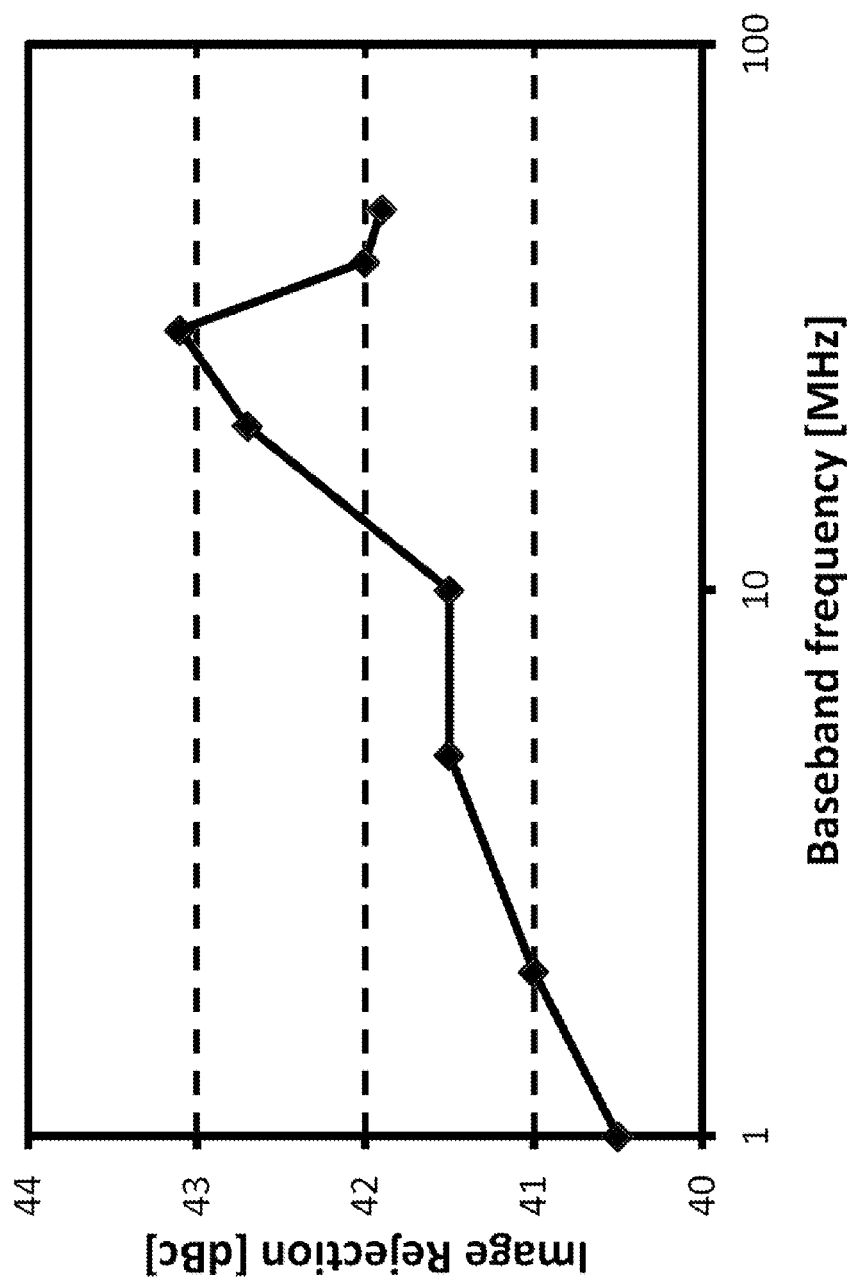

FIGS. 7A-7C are exemplary graphs of measurement results, according to certain embodiments. FIG. 7A plots the monolithic SDRX NF vs. the LO frequency. The external LNA influence and board losses have been de-embedded. On the same chart, the monolithic SDRX OIP3 (third order intercept point) at minimum SDRX gain is shown. The OIP3 has been measured with the external LNA bypassed. As can be seen, the NF<25 dB and OIP3>+28 dBm. The SDRX gain is monotonic, and the RFPGA and IFPGA gain steps are shown in FIG. 7B. The RFPGA gain step is centered on 0.5 dB, but a larger step is observed when the gain interpolation switch groups change. The IFPGA gain error is within ±0.1 dB. Finally, the SDRX image rejection is revealed in FIG. 7C. The IR is mostly flat within the IF band and larger than 40 dB. The measurements summary is given in Table II.

A hardware description of a controller according to exemplary embodiments is described with reference to FIG. 8. The controller includes a CPU 800 that perform the processes described herein. The process data and instructions may be stored in memory 802. These processes and instructions may also be stored on a storage medium disk 804 such as a hard drive (HDD) or portable storage medium or may be stored remotely. Further, the claimed advancements are not limited by the form of the computer-readable media on which the instructions of the inventive process are stored. For example, the instructions may be stored on CDs, DVDs, in FLASH memory, RAM, ROM, PROM, EPROM, EEPROM, hard disk or any other information processing device with which the controller communicates.

TABLE II

SDRX PERFORMANCE SUMMARY

| Parameter | Value |
|---|---|
| Maximum output voltage swing | 1.5 Vppd (at 1.8 V supply) |
| OIP3 @ min gain | >28 dBm (external LNA bypassed) |
| NF @ max gain | <25 dB (external LNA de-embedded) |
| RX gain range/gain step | 61 dB/<1 dB |
| Analog low pass −3 dB frequency range | 20 . . . 120 MHz |
| Harmonic rejection | |
| $3^{rd}$ LO harmonic | >−42 dBc |
| $5^{th}$ LO harmonic | >−46 dBc |
| Image rejection | >40 dB |
| Power consumption from 1.8 V supply: | |
| Channel bandwidth up to 100 MHz | 180 mW |
| Channel bandwidth up to 225 MHz | 265 mW |

Further, the claimed advancements may be provided as a utility application, background daemon, or component of an operating system, or combination thereof, executing in conjunction with CPU 800 and an operating system such as Microsoft Windows 7, UNIX, Solaris, LINUX, Apple MAC-OS and other systems known to those skilled in the art.

CPU 800 may be a Xenon or Core processor from Intel of America or an Opteron processor from AMD of America, or may be other processor types that would be recognized by one of ordinary skill in the art. Alternatively, the CPU 800 may be implemented on an FPGA, ASIC, PLD or using discrete logic circuits, as one of ordinary skill in the art would recognize. Further, CPU 800 may be implemented as multiple processors cooperatively working in parallel to perform the instructions of the inventive processes described above.

Figure 8:
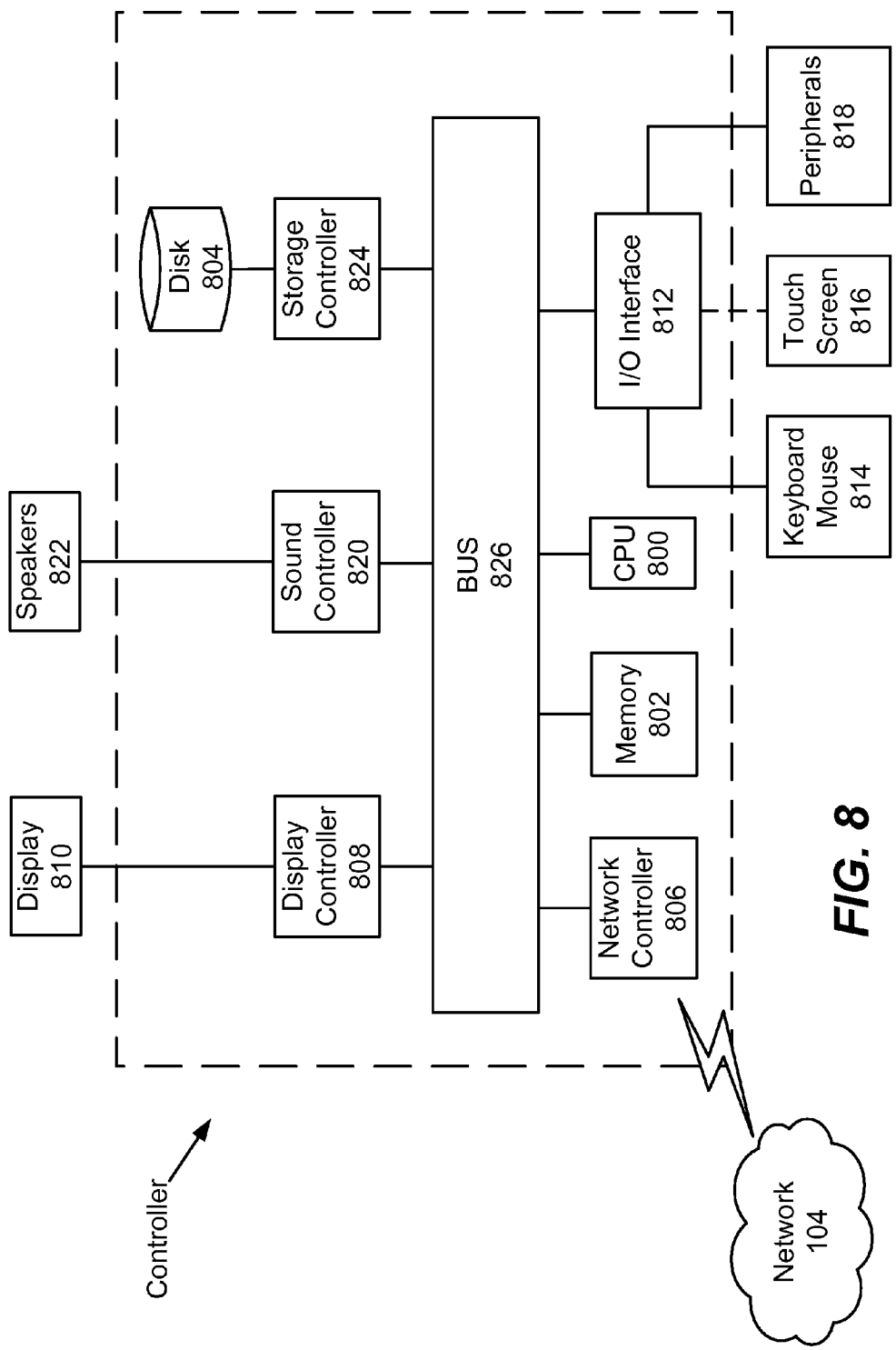
FIG. 8 illustrates a non-limiting example of a server, according to certain embodiments.

The controller in FIG. 8 also includes a network controller 806, such as an Intel Ethernet PRO network interface card from Intel Corporation of America, for interfacing with network 104. As can be appreciated, the network 104 can be a public network, such as the Internet, or a private network such as an LAN or WAN network, or any combination thereof and can also include PSTN or ISDN sub-networks. The network 104 can also be wired, such as an Ethernet network, or can be wireless such as a cellular network including EDGE, 3G and 4G wireless cellular systems. The wireless network can also be Wi-Fi, Bluetooth, or any other wireless form of communication that is known.

The controller further includes a display controller 808, such as a NVIDIA GeForce GTX or Quadro graphics adaptor from NVIDIA Corporation of America for interfacing with display 810 of the controller and the computer 110, such as a Hewlett Packard HPL2445w LCD monitor. A general purpose I/O interface 812 at the controller interfaces with a keyboard and/or mouse 814 as well as a touch screen panel 816 on or separate from display 810. General purpose I/O interface 812 also connects to a variety of peripherals

818 including printers and scanners, such as an OfficeJet or DeskJet from Hewlett Packard.

A sound controller 820 is also provided in the controller, such as Sound Blaster X-Fi Titanium from Creative, to interface with speakers/microphone 822 thereby providing sounds and/or music.

The general purpose storage controller 824 connects the storage medium disk 804 with communication bus 826, which may be an ISA, EISA, VESA, PCI, or similar, for interconnecting all of the components of the controller. A description of the general features and functionality of the display 810, keyboard and/or mouse 814, as well as the display controller 808, storage controller 824, network controller 806, sound controller 820, and general purpose I/O interface 812 is omitted herein for brevity as these features are known.

In other alternate embodiments, processing features according to the present disclosure may be implemented and commercialized as hardware, a software solution, or a combination thereof. Moreover, instructions corresponding to the SDRX process 500 in accordance with the present disclosure could be stored in a thumb drive that hosts a secure process.

A number of implementations have been described. Nevertheless, it will be understood that various modifications may be made without departing from the spirit and scope of this disclosure. For example, preferable results may be achieved if the steps of the disclosed techniques were performed in a different sequence, if components in the disclosed systems were combined in a different manner, or if the components were replaced or supplemented by other components. The functions, processes and algorithms described herein may be performed in hardware or software executed by hardware, including computer processors and/or programmable circuits configured to execute program code and/or computer instructions to execute the functions, processes and algorithms described herein. Additionally, an implementation may be performed on modules or hardware not identical to those described. Accordingly, other implementations are within the scope that may be claimed.

Based on the teachings described herein, the SRDX 100 area and power can be reduced because the higher bandwidth achieved by the SRDX 100 translates to a reduction in roll-off at higher frequencies, which results in a higher SNR. Also, because the gain step size has been reduced, the ADC dynamic range may not be increased by an amount that corresponds to the gain step size.

The invention claimed is:

1. A device comprising:
   circuitry configured to
   attenuate a signal burst based on a first predetermined gain step,
   reject one or more harmonic frequencies of the signal burst at a harmonic rejection mixer based on predetermined harmonic rejection modes,
   filter an output of the harmonic rejection mixer based on a predetermined image rejection rate,
   amplify the output of the harmonic rejection mixer via a programmable gain operational amplifier having a first differential input of a differential input pair corresponding to at least one switch of one or more switch sets associated with a second predetermined gain step and a second differential input of the differential input pair connected to ground, and
   output an enhanced signal burst to at least one analog-to-digital converter (ADC).

2. The device of claim 1, wherein the circuitry is further configured to receive the signal burst from a receiver back-end including at least one of a bandpass filter and an external low noise amplifier (LNA).

3. The device of claim 1, wherein the circuitry is further configured to filter the signal burst to achieve a greater than 40 dB image rejection rate.

4. The device of claim 1, wherein the circuitry is further configured to filter the signal burst to reduce signal aliasing by the at least one ADC.

5. The device of claim 1, wherein the circuitry is further configured to attenuate the signal burst at the first predetermined gain step via a resistive ladder controlled by toggling one or more connected switch sets.

6. The device of claim 5, wherein the first predetermined gain step is equal to 0.5 dB.

7. The device of claim 5, wherein the one or more switch sets include twelve switches that are toggled based on a number of on switches in an adjacent switch set.

8. The device of claim 1, wherein the circuitry is further configured to mix one or more local oscillator (LO) signals corresponding to a weighted mixer core.

9. The device of claim 8, wherein the circuitry is further configured to generate phases for the one or more LO signals over a predetermined frequency range via a programmable counter.

10. The device of claim 9, wherein the circuitry is further configured to
    reject a third and fifth local oscillator (LO) harmonic in a first harmonic rejection mode;
    reject a third LO harmonic in a second harmonic rejection mode; and
    reject no LO harmonics in a third harmonic rejection mode.

11. The device of claim 1, wherein the circuitry is further configured to perform harmonic rejection for I and Q components of the signal burst.

12. The device of claim 1, wherein the at least one switch of the one or more switch sets is outside a signal control path.

13. The device of claim 1, wherein the circuitry is further configured to modify at least one of a linearity and noise performance of the enhanced signal burst in response to a control signal issued from an automated gain control (AGC) loop.

14. The device of claim 1, wherein the device is included in a front end of a software defined receiver.

15. The device of claim 1, wherein the first differential input of the differential input pair corresponds to a negative input to the programmable gain operational amplifier.

16. A device comprising:
    circuitry configured to
    attenuate a signal burst based on a first predetermined gain step,
    reject one or more harmonic frequencies of the signal burst at a harmonic rejection mixer based on predetermined harmonic rejection modes,
    filter an output of the harmonic rejection mixer based on a predetermined image rejection rate,
    amplify the output of the harmonic rejection mixer via a programmable gain operational amplifier having a first differential input of a differential input pair corresponding to at least one switch of one or more switch sets associated with a second predetermined gain step that is determined based on at least one of a strength of the signal burst, predetermined performance criteria, and ADC loading criteria and a second differential input of the differential input pair connected to ground, and output an enhanced signal burst to at least one analog-to-digital converter (ADC).

17. A device comprising:

circuitry configured to attenuate a signal burst based on a first predetermined gain step, reject one or more harmonic frequencies of the signal burst at a harmonic rejection mixer based on predetermined harmonic rejection modes, filter an output of the harmonic rejection mixer based on a predetermined image rejection rate, amplify the output of the harmonic rejection mixer via a programmable gain operational amplifier having a first differential input of a differential input pair corresponding to at least one switch of one or more switch sets associated with a second predetermined gain step and a second differential input of the differential input pair connected to ground, control the second predetermined gain step of the programmable gain operational amplifier based on selected adjacent switch sets of the one or more switch sets that correspond to one or more resistors in a resistive feedback line, and output an enhanced signal burst to at least one analog-to-digital converter (ADC).

18. The device of claim 17, wherein the second predetermined gain step of the programmable gain operational amplifier includes a coarse gain component and a fine gain component.

19. The device of claim 18, wherein the coarse gain component of the second predetermined gain step is based on values of the one or more resistors in the resistive feedback line and the selected adjacent switch sets.

20. The device of claim 18, wherein the circuitry is further configured to control the fine gain component of the second predetermined gain step by interpolating the one or more differential input pairs between the at least one switch associated with the selected adjacent switch sets.

* * * * *